(12) United States Patent
Lin et al.

(10) Patent No.: US 12,200,904 B2
(45) Date of Patent: Jan. 14, 2025

(54) IMMERSION COOLING SYSTEM AND IMMERSION COOLING METHOD

(71) Applicant: DELTA ELECTRONICS, INC., Taoyuan (TW)

(72) Inventors: Wei-Chih Lin, Taoyuan (TW); Ren-Chun Chang, Taoyuan (TW); Yan-Hui Jian, Taoyuan (TW); Wen-Yin Tsai, Taoyuan (TW); Li-Hsiu Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 304 days.

(21) Appl. No.: 17/805,467

(22) Filed: Jun. 5, 2022

(65) Prior Publication Data

US 2023/0022650 A1   Jan. 26, 2023

Related U.S. Application Data

(60) Provisional application No. 63/223,984, filed on Jul. 21, 2021.

(30) Foreign Application Priority Data

Feb. 21, 2022  (CN) .......................... 202210157534.X

(51) Int. Cl.
*H05K 7/20* (2006.01)

(52) U.S. Cl.
CPC ..... *H05K 7/20272* (2013.01); *H05K 7/20236* (2013.01); *H05K 7/20263* (2013.01); *H05K 7/20772* (2013.01)

(58) Field of Classification Search
CPC ........... H05K 7/20272; H05K 7/20236; H05K 7/20263; H05K 7/20772
See application file for complete search history.

(56) References Cited

U.S. PATENT DOCUMENTS

| | | | |
|---|---|---|---|
| 8,713,957 B2 | 5/2014 | Campbell et al. | |
| 9,844,166 B2 | 12/2017 | Shelnutt et al. | |

(Continued)

FOREIGN PATENT DOCUMENTS

| | | |
|---|---|---|
| CN | 200974767 Y | 11/2007 |
| CN | 111643954 A | 9/2020 |

(Continued)

OTHER PUBLICATIONS

An immersion data center machine cabinet cooling system an control method thereof; Tian et al. (Year: 2020).*

*Primary Examiner* — Michael A Matey
(74) *Attorney, Agent, or Firm* — CKC & Partners Co., LLC

(57) ABSTRACT

An immersion cooling system includes a cooling tank and a filtration system. The cooling tank is configured to accommodate a liquid coolant and an electronic device immersed in the liquid coolant. The filtration system includes a pipeline, a pump, a filter and a cooling device. The pipeline is in fluid communication with the cooling tank. The pump is disposed in the pipeline and is configured to drive the liquid coolant to flow through the pipeline. The filter is disposed in the pipeline and is configured to filter the liquid coolant. The cooling device is connected to the pipeline and is configured to cool the liquid coolant. The pipeline has an inlet connected to the cooling tank. The cooling device is located between the pump and the inlet of the pipeline.

14 Claims, 3 Drawing Sheets

(56) References Cited

U.S. PATENT DOCUMENTS

| | | | |
|---|---|---|---|
| 10,143,113 B2 | 11/2018 | Shelnutt et al. | |
| 10,206,307 B2 | 2/2019 | Lau | |
| 10,773,192 B1 | 9/2020 | Lau | |
| 10,966,349 B1 | 3/2021 | Lau | |
| 2016/0345461 A1 | 11/2016 | Smith | |
| 2019/0053402 A1 | 2/2019 | Smith, III | |
| 2019/0159360 A1 | 5/2019 | Uchida | |
| 2019/0357379 A1 | 11/2019 | Kolar | |
| 2020/0084918 A1 | 3/2020 | Shen et al. | |
| 2020/0267872 A1* | 8/2020 | Harada | H05K 7/20272 |
| 2020/0305310 A1 | 9/2020 | Alissa et al. | |
| 2021/0120705 A1 | 4/2021 | Enright et al. | |

FOREIGN PATENT DOCUMENTS

| | | |
|---|---|---|
| CN | 112394792 A | 2/2021 |
| CN | 112654213 A | 4/2021 |
| TW | 201816542 A | 5/2018 |
| TW | I633407 B | 8/2018 |
| TW | I640239 B | 11/2018 |
| TW | 201925947 A | 7/2019 |
| TW | 202020385 A | 6/2020 |
| TW | 202106363 A | 2/2021 |
| TW | M610160 U | 4/2021 |

\* cited by examiner

IMMERSION COOLING SYSTEM AND IMMERSION COOLING METHOD

RELATED APPLICATIONS

This application claims priority to U.S. Provisional Application Ser. No. 63/223,984 filed Jul. 21, 2021, and China Application Serial Number 202210157534.X, filed Feb. 21, 2022, the disclosures of which are incorporated herein by reference in their entireties.

BACKGROUND

Technical Field

The present disclosure relates to an immersion cooling system and an immersion cooling method.

Description of Related Art

In immersion cooling systems, contamination of liquid coolant is a common problem. Consequently, it is necessary to filter the liquid coolant. During the process of drawing the coolant for filtration, the liquid coolant experiences pressure drop as a result of passing through pipes or valves. The pressure drop might further lead to the occurrence of cavitation.

SUMMARY

In view of the foregoing, one of the objects of the present disclosure is to provide an immersion cooling system that provides filtering function and can prevent cavitation.

To achieve the objective stated above, in accordance with an embodiment of the present disclosure, an immersion cooling system includes a cooling tank and a filtration system. The cooling tank is configured to accommodate a liquid coolant and an electronic device immersed in the liquid coolant. The filtration system includes a pipeline, a pump, a filter and a cooling device. The pipeline is in fluid communication with the cooling tank. The pump is disposed in the pipeline and is configured to drive the liquid coolant to flow through the pipeline. The filter is disposed in the pipeline and is configured to filter the liquid coolant. The cooling device is connected to the pipeline and is configured to cool the liquid coolant. The pipeline has an inlet connected to the cooling tank. The cooling device is located between the pump and the inlet of the pipeline.

In one or more embodiments of the present disclosure, the cooling device is configured to cool the liquid coolant to a temperature below a saturation temperature corresponding to a pressure in the pipeline.

In one or more embodiments of the present disclosure, the pipeline further has an outlet connected to the cooling tank. The filter is located between the pump and the outlet of the pipeline.

In one or more embodiments of the present disclosure, the filter is connected to an output port of the pump.

In one or more embodiments of the present disclosure, the cooling device is connected to an input port of the pump.

In one or more embodiments of the present disclosure, the pump is configured to drive the liquid coolant to flow through the cooling device, the pump and the filter in order.

In one or more embodiments of the present disclosure, the filter is configured to remove at least one of particles, plasticizer or water from the liquid coolant.

In one or more embodiments of the present disclosure, the filter includes at least one of a filter screen, a semipermeable membrane or an activated carbon.

In one or more embodiments of the present disclosure, a position of the pump is below a surface of the liquid coolant in the cooling tank.

In one or more embodiments of the present disclosure, the cooling device is configured to circulate a liquid or a gas to make heat exchange with the liquid coolant.

In one or more embodiments of the present disclosure, the pipeline extends into the cooling tank and has an outlet located within the cooling tank. The filter is disposed at the outlet of the pipeline.

In one or more embodiments of the present disclosure, the pipeline further has an outlet. The outlet is connected to the cooling tank and is located above a surface of the liquid coolant in the cooling tank.

In accordance with an embodiment of the present disclosure, an immersion cooling method includes: immersing an electronic device in a liquid coolant in a cooling tank; using a pump to draw the liquid coolant from the cooling tank into a pipeline for filtration; and cooling the liquid coolant before the liquid coolant enters the pump.

In one or more embodiments of the present disclosure, the liquid coolant is cooled to a temperature below a saturation temperature corresponding to a pressure in the pipeline before entering the pump.

In one or more embodiments of the present disclosure, the method further includes: causing the liquid coolant to pass through a filter after leaving the pump.

In sum, in the immersion cooling system of the present disclosure, the filtration system includes a cooling device installed before the pump, and the liquid coolant enters the pump after being cooled by the cooling device. By this arrangement, cavitation can be prevented.

BRIEF DESCRIPTION OF THE DRAWINGS

To make the objectives, features, advantages, and embodiments of the present disclosure, including those mentioned above and others, more comprehensible, descriptions of the accompanying drawings are provided as follows.

DETAILED DESCRIPTION

Figure 1:
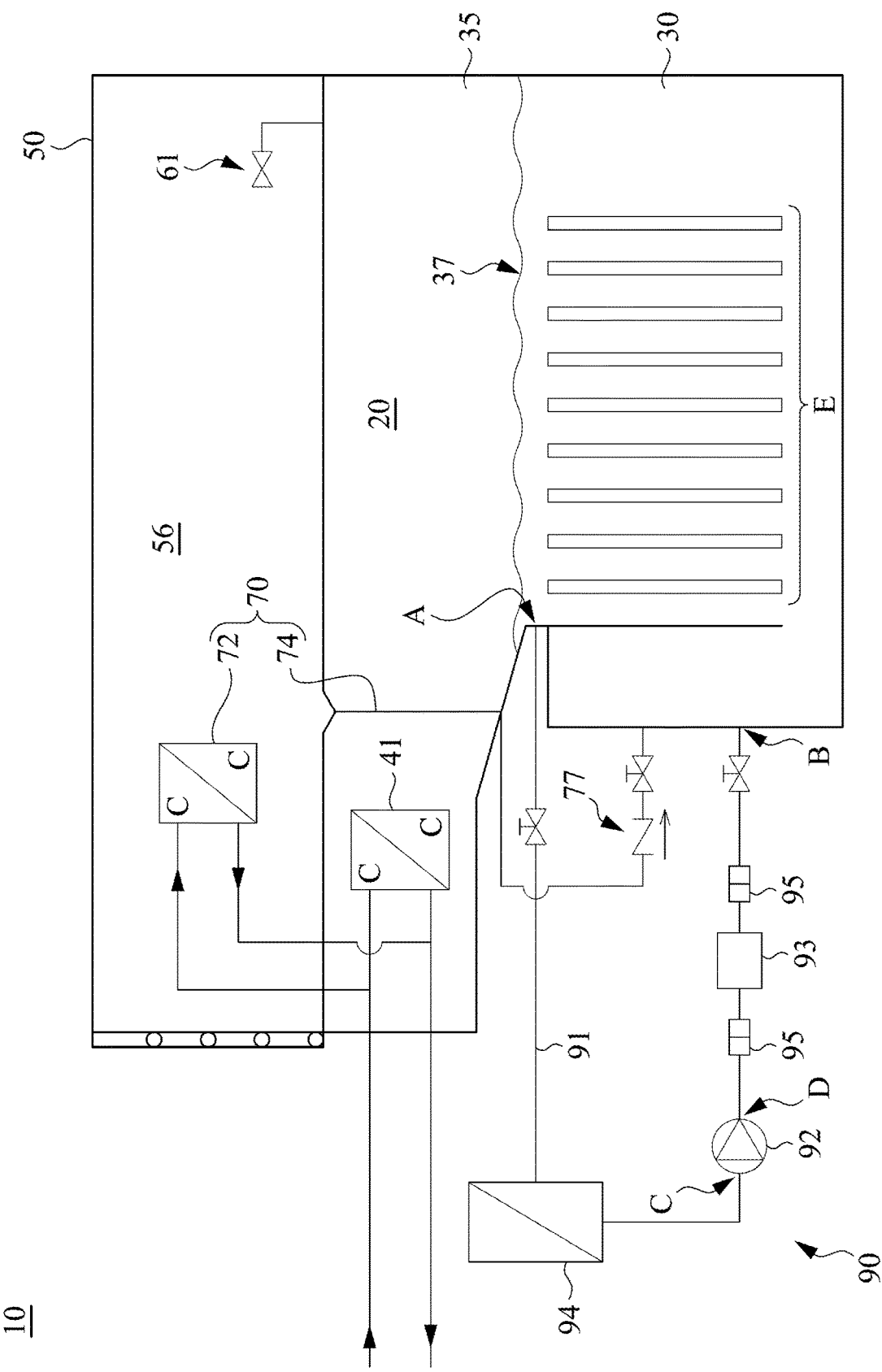
FIG. 1 illustrates a schematic view of an immersion cooling system in accordance with an embodiment of the present disclosure.

For the completeness of the description of the present disclosure, reference is made to the accompanying drawings and the various embodiments described below. Various features in the drawings are not drawn to scale and are provided for illustration purposes only. To provide full understanding of the present disclosure, various practical details will be explained in the following descriptions. However, a person with an ordinary skill in relevant art should realize that the present disclosure can be implemented without one or more of the practical details. Therefore, the present disclosure is not to be limited by these details.

Reference is made to FIG. 1. An immersion cooling system 10 includes a cooling tank 20. The cooling tank 20 is configured to accommodate a liquid coolant 30 and one or more electronic devices E immersed in the liquid coolant 30. The electronic devices E may include, for example, one or more computer servers or data storage devices. During operation, the electronic devices E produce heat. The liquid coolant 30 is configured to contact the electronic devices E and absorb heat therefrom, so as to facilitate the cooling of the electronic devices E. The liquid coolant 30 is a non-conductive liquid, such as a dielectric liquid.

As shown in FIG. 1, in some embodiments, the liquid coolant 30 in the cooling tank 20 partially vaporizes as a result of absorbing heat from the electronic devices E. The part of the cooling tank 20 above the liquid coolant 30 includes a vaporized coolant 35 that vaporized from the liquid coolant 30. The immersion cooling system 10 further includes a condenser 41. The condenser 41 is disposed in the cooling tank 20 and is configured to perform a condensing operation. The condensing operation includes condensing at least part of the vaporized coolant 35 to the liquid coolant 30. In the two-phase cooling method described above, the liquid coolant 30 facilitates the cooling of the electronic devices E by repeating the process of: (i) absorbing heat from the electronic devices E and vaporizing; and (ii) being converted back to the liquid state by the condenser 41.

As shown in FIG. 1, the immersion cooling system 10 further includes a filtration system 90. The filtration system 90 is connected to the cooling tank 20 and is configured to draw the liquid coolant 30 from the cooling tank 20 for filtration, so as to remove contaminates from the liquid coolant 30 (e.g., contaminates that reside in the cooling tank 20 or the electronic devices E might mix into the liquid coolant 30). Removing contaminates from the liquid coolant 30 can improve the efficiency of the immersion cooling system 10.

As shown in FIG. 1, the filtration system 90 includes a pipeline 91 in fluid communication with the cooling tank 20. The pipeline 91 has an inlet A and an outlet B. The inlet A and the outlet B of the pipeline 91 are both connected to the cooling tank 20, and the positions of the inlet A and the outlet B are below a surface 37 of the liquid coolant 30 in the cooling tank 20. The inlet A is where the liquid coolant 30 in the cooling tank 20 flows into the pipeline 91, and the outlet B is where the liquid coolant 30 flows out of the pipeline 91 and returns to the cooling tank 20.

As shown in FIG. 1, the filtration system 90 further includes a pump 92 configured to draw the liquid coolant 30 from the cooling tank 20 into the pipeline 91 for filtration. Specifically, the pump 92 is disposed in the pipeline 91 and is configured to drive the liquid coolant 30 to flow through the pipeline 91. When driven by the pump 92, the liquid coolant 30 enters the pipeline 91 from the inlet A and exits the pipeline 91 from the outlet B.

As shown in FIG. 1, the filtration system 90 further includes a filter 93. The filter 93 is disposed in the pipeline 91 and is configured to filter the liquid coolant 30 passing through the pipeline 91. The filter 93 can remove contaminates from the liquid coolant 30, such that the efficiency of the immersion cooling system 10 can be improved. In some embodiments, the filter 93 is configured to remove at least one of particles, plasticizer or water from the liquid coolant 30. In some embodiments, the filter 93 includes at least one of a filter screen, a semipermeable membrane or an activated carbon. In some embodiments, the filter 93 is provided with connectors 95 on its two ends. The filter 93 is removably connected to the pipeline 91 via the connectors 95 to facilitate the replacement of the filter 93 in the filtration system 90. In some embodiments, the connectors 95 include quick connect fittings.

In two-phase cooling, the liquid coolant 30 in the cooling tank 20 is kept at a temperature close to the boiling point. As the liquid coolant 30 passes through the pipeline 91, the liquid coolant 30 suffers from pressure loss due to the pipeline 91 itself or the components in the pipeline 91. In addition, the liquid coolant 30 would also experience pressure drop when the liquid coolant 30 enters the low pressure region of the pump 92. These factors may reduce the pressure of the liquid coolant 30 to below the saturation vapor pressure, leading to the formation of bubbles in the liquid coolant 30. When subject to high pressure (e.g., when passing through the pump 92), the bubbles in the liquid coolant 30 may collapse and generate shock waves that can damage system components or cause problems such as vibration or noise.

In view of said issue, as shown in FIG. 1, the filtration system 90 further includes a cooling device 94. The cooling device 94 is connected to the pipeline 91 and is configured to cool the liquid coolant 30 passing through the pipeline 91. The cooling device 94 is located between the pump 92 and the inlet A of the pipeline 91, and the pipeline 91 passes through the cooling device 94, such that the liquid coolant 30 flowing into the pipeline 91 is cooled by the cooling device 94 before entering the pump 92. By this arrangement, the saturation vapor pressure of the liquid coolant 30 can be lowered, and the problem of cavitation thus becomes less likely to occur. As a result, the lifespan of the pump 92 is increased, and the pump 92 would generate less vibration/noise. In some embodiments, the cooling device 94 is configured to cool the liquid coolant 30 to a temperature below a saturation temperature of the liquid coolant 30 corresponding to a pressure in the pipeline 91. In other words, the liquid coolant 30 is cooled to a temperature below the saturation temperature before entering the pump 92. In some embodiments, the cooling device 94 is connected to an input port C of the pump 92.

In some embodiments, the cooling device 94 includes a liquid-to-liquid heat exchanger or a gas-to-liquid heat exchanger. In some embodiments, the cooling device 94 is configured to circulate a liquid or a gas to make heat exchange with the liquid coolant 30, so as to lower the temperature of the liquid coolant 30.

As shown in FIG. 1, in some embodiments, the filter 93 is located between the pump 92 and the outlet B of the pipeline 91. Accordingly, the liquid coolant 30 flowing into the pipeline 91 passes through the pump 92 before entering the filter 93, or in other words, the liquid coolant 30 passes through the filter 93 after leaving the pump 92. In other embodiments, the filter 93 may alternatively be disposed at the outlet B of the pipeline 91.

The filter 93 also causes pressure loss of the liquid coolant 30. By positioning the filter 93 between the pump 92 and the outlet B of the pipeline 91 or positioning the filter 93 at the outlet B of the pipeline 91, the liquid coolant 30 would be free of the extra pressure loss caused by the filter 93, and the likelihood of cavitation occurring in the pump 92 can be further reduced. Besides, positioning the filter 93 between the pump 92 and the outlet B of the pipeline 91 or positioning the filter 93 at the outlet B of the pipeline 91 can also reduce the load of the cooling device 94. If the liquid coolant 30 passes through the filter 93 before entering the pump 92, then the cooling device 94 would have to cool the liquid coolant 30 to a lower temperature to prevent cavitation, because of the extra pressure loss caused by the filter 93.

As shown in FIG. 1, in some embodiments, the filter 93 is connected to an output port D of the pump 92. In some embodiments, the pump 92 is configured to drive the liquid coolant 30 to flow through the cooling device 94, the pump 92 and the filter 93 in order (i.e., in the order of the cooling device 94, followed by the pump 92, and then followed by the filter 93). In other words, on the flow path of the liquid coolant 30, the cooling device 94 is positioned before the pump 92, and the pump 92 is positioned before the filter 93.

As shown in FIG. 1, in some embodiments, a position of the pump 92 is below the surface 37 of the liquid coolant 30 in the cooling tank 20. By virtue of the height difference between the pump 92 and the surface 37 of the liquid coolant 30, the pressure of the liquid coolant 30 can be increased and the likelihood of cavitation occurring in the pump 92 can be further reduced. In some embodiments, the pump 92 is located below the cooling tank 20.

Generally speaking, the gas pressure inside the cooling tank 20 is positively correlated with the workload of the electronic devices E. Specifically, when the workload of the electronic devices E is increased (e.g., when the amount of computation performed by the electronic devices E is increased), the electronic devices E would generate more heat per unit time. As a result, the liquid coolant 30 would be vaporized more quickly, and the gas pressure inside the cooling tank 20 increases accordingly. On the other hand, when the workload of the electronic devices E is reduced, the electronic devices E would generate less heat per unit time. As a result, the liquid coolant 30 would be vaporized more slowly, and the gas pressure inside the cooling tank 20 decreases accordingly.

As shown in FIG. 1, the immersion cooling system 10 further includes a housing 50. The housing 50 covers a side of the cooling tank 20 and thereby forms an enclosure 56. The enclosure 56 has a fixed volume. In the illustrated embodiment, the housing 50 covers the top side of the cooling tank 20. In some embodiments, the housing 50 may include metal, glass, acrylic, other suitable materials or any combination thereof.

As shown in FIG. 1, the immersion cooling system 10 further includes a valve 61. The valve 61 has two ports, one of which communicates with the enclosure 56 and the other communicates with the part of the cooling tank 20 above the liquid coolant 30 (i.e., the space inside the cooling tank 20 that is filled with the vaporized coolant 35). The valve 61 is configured to switch between an open state and a closed state. When the valve 61 is in the open state, the valve 61 allows the flow of gas between the enclosure 56 and the cooling tank 20. When the valve 61 is in the closed state, the valve 61 prohibits the flow of gas between the enclosure 56 and the cooling tank 20.

Continuing from the discussion in the previous paragraph, the valve 61 is configured to open in response to the gas pressure inside the cooling tank 20 exceeding an upper limit. The opening of the valve 61 enables the flow of gas from the cooling tank 20 to the enclosure 56, and the gas pressure inside the cooling tank 20 is reduced accordingly. As a result, structural damage of the cooling tank 20 can be prevented, and the liquid coolant 30 can be kept from having an excessively high boiling point as well, which could lead to poor heat dissipation for the electronic devices E. The gas flowing from the cooling tank 20 to the enclosure 56 includes the vaporized coolant 35, and may additionally include other gases mixing in the vaporized coolant 35, such as air or water vapor.

In the immersion cooling system 10 of the present disclosure, when the gas pressure inside the cooling tank 20 is too high, the gas inside the cooling tank 20 can be discharged to the enclosure 56 located on a side of the cooling tank 20, rather than being discharged directly to the atmosphere. By this arrangement, the vaporized coolant 35 would not be lost. The vaporized coolant 35 can be collected by the enclosure 56 and can be recycled to the cooling tank 20 for reuse.

As shown in FIG. 1, in some embodiments, the immersion cooling system 10 further includes a recycling system 70. The recycling system 70 includes a condenser 72 and a recycling pipe 74. The condenser 72 is disposed in the enclosure 56 and is configured to condense the vaporized coolant 35 in the enclosure 56. The recycling pipe 74 has two opposite ends, one of which is connected to the enclosure 56 and the other is connected to the cooling tank 20. The recycling pipe 74 is configured to guide the liquid coolant 30 condensed by the condenser 72 to flow into the cooling tank 20. In some embodiments, the recycling pipe 74 includes a check valve 77 configured to prevent the backflow of the liquid coolant 30 or the vaporized coolant 35 from the cooling tank 20 to the enclosure 56.

Figure 2:
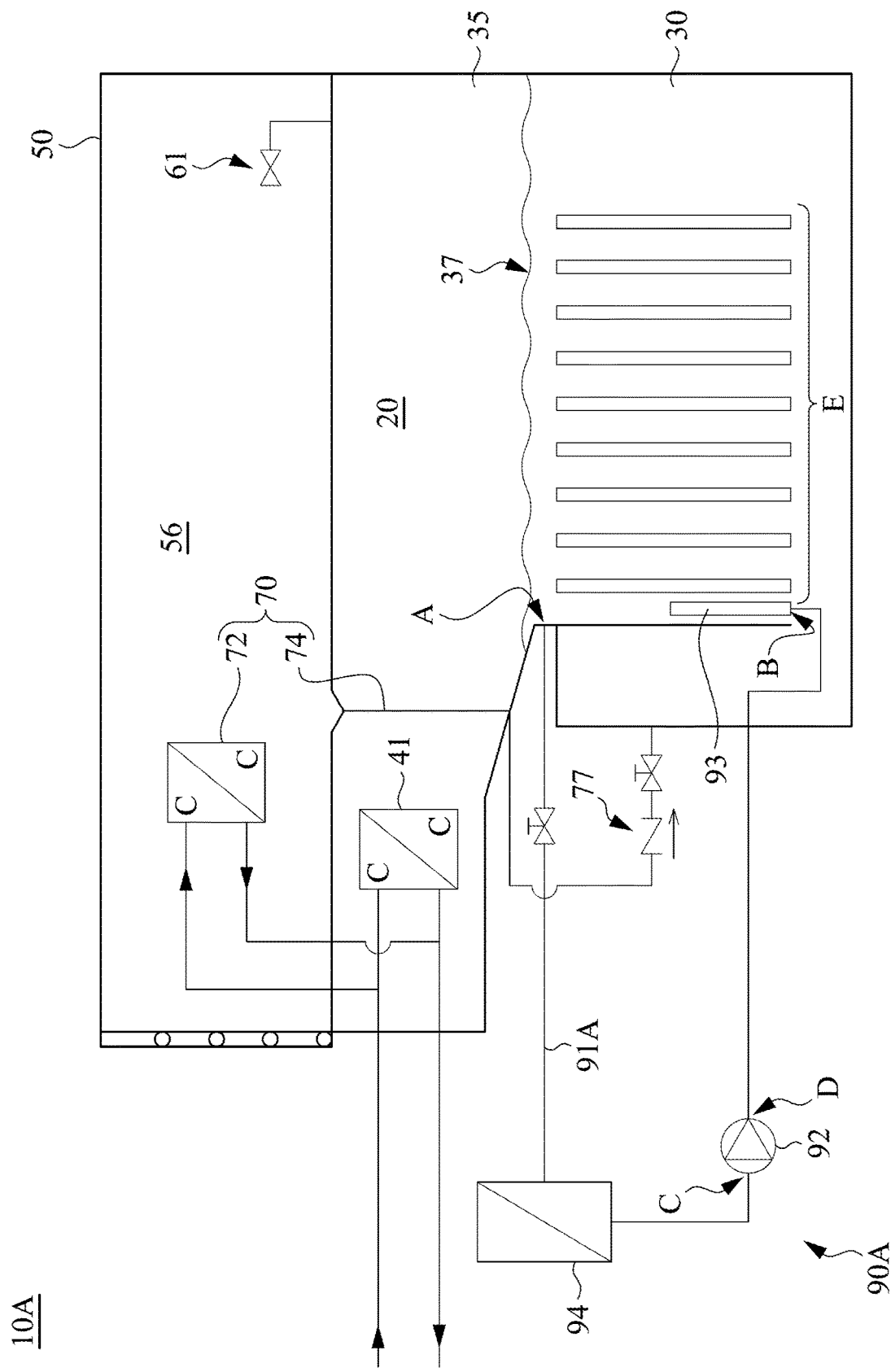
FIG. 2 illustrates a schematic view of an immersion cooling system in accordance with another embodiment of the present disclosure.

Reference is made to FIG. 2. The immersion cooling system 10A of the present embodiment differs from the embodiment shown in FIG. 1 in that the pipeline 91A of the filtration system 90A penetrates a wall of the cooling tank 20 and extends into the cooling tank 20, such that the outlet B of the pipeline 91A is located within the cooling tank 20. Moreover, in the present embodiment, the filter 93 of the filtration system 90A is disposed at the outlet B of the pipeline 91A. Hence, the filter 93 is also located within the cooling tank 20 and is immersed in the liquid coolant 30.

Figure 3:
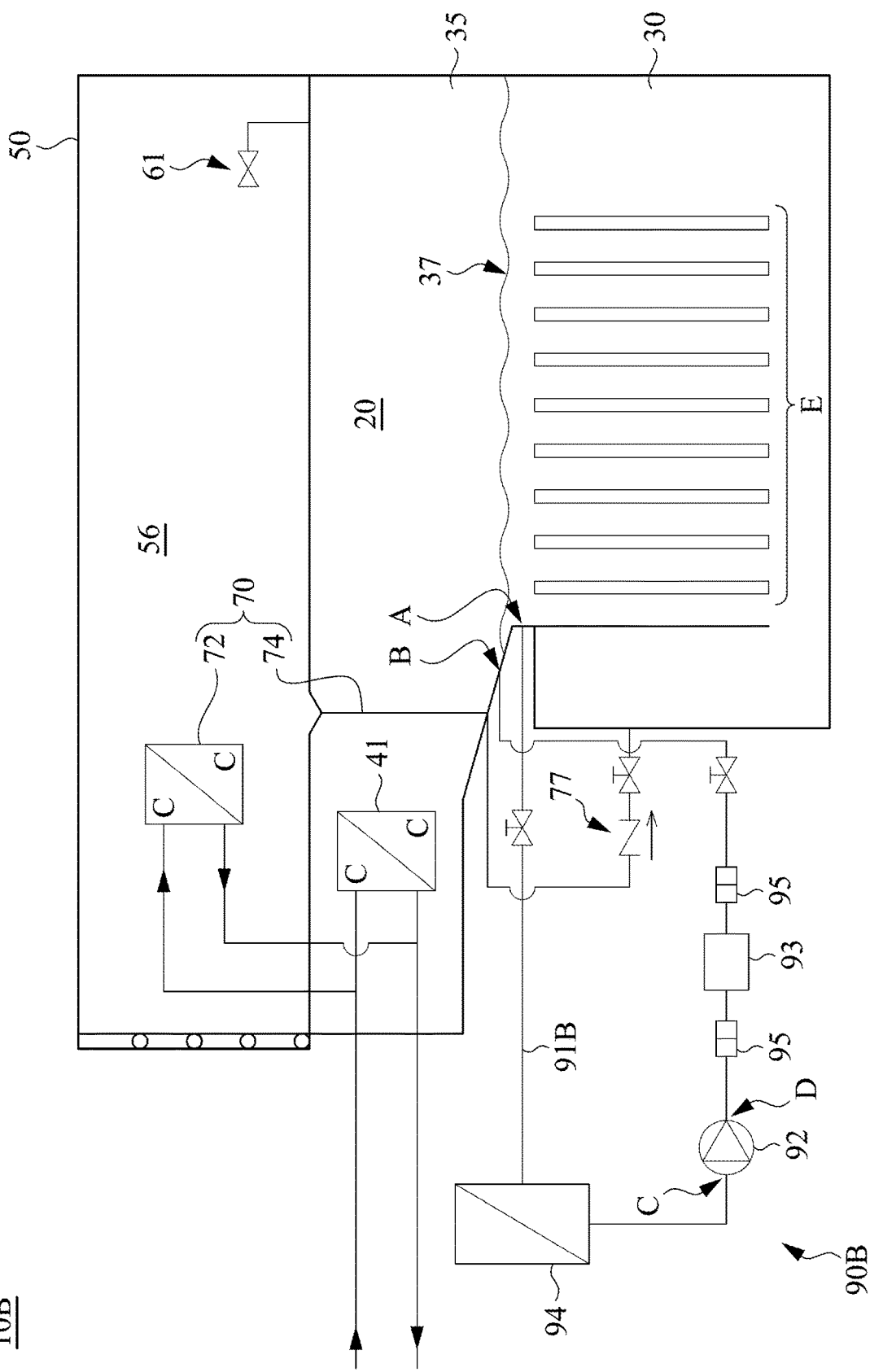
FIG. 3 illustrates a schematic view of an immersion cooling system in accordance with another embodiment of the present disclosure.

Reference is made to FIG. 3. The immersion cooling system 10B of the present embodiment differs from the embodiment shown in FIG. 1 in that the outlet B of the pipeline 91B of the filtration system 90B is located above the surface 37 of the liquid coolant 30 in the cooling tank 20. Consequently, after being filtered by the filtration system 90B, the liquid coolant 30 flows back to the cooling tank 20 at the part of the cooling tank 20 above the surface 37 of the liquid coolant 30. In some embodiments, the outlet B of the pipeline 91B is connected to a sloping wall of the cooling tank 20.

In sum, in the immersion cooling system of the present disclosure, the filtration system includes a cooling device installed before the pump, and the liquid coolant enters the pump after being cooled by the cooling device. By this arrangement, cavitation can be prevented.

Although the present disclosure has been described by way of the exemplary embodiments above, the present disclosure is not to be limited to those embodiments. Any person skilled in the art can make various changes and modifications without departing from the spirit and the scope of the present disclosure. Therefore, the protective scope of the present disclosure shall be the scope of the claims as attached.

What is claimed is:

1. An immersion cooling system, comprising:
   a cooling tank configured to accommodate a liquid coolant and an electronic device, the electronic device being immersed in the liquid coolant; and
   a filtration system, comprising:
     a pipeline in fluid communication with the cooling tank;
     a pump disposed in the pipeline and configured to drive the liquid coolant to flow through the pipeline;
     a filter disposed in the pipeline and configured to filter the liquid coolant; and a cooling device connected to the pipeline and configured to cool the liquid coolant, wherein the pipeline has an inlet connected to the cooling tank, and the cooling device is located between the pump and the inlet of the pipeline, and wherein the cooling device is directly connected to an input port of the pump via the pipeline.

2. The immersion cooling system of claim 1, wherein the cooling device is configured to cool the liquid coolant to a temperature below a saturation temperature corresponding to a pressure in the pipeline.

3. The immersion cooling system of claim 1, wherein the pipeline further has an outlet connected to the cooling tank, the filter is located between the pump and the outlet of the pipeline.

4. The immersion cooling system of claim 3, wherein the filter is connected to an output port of the pump.

5. The immersion cooling system of claim 1, wherein the pump is configured to drive the liquid coolant to flow through the cooling device, the pump and the filter in order.

6. The immersion cooling system of claim 1, wherein the filter is configured to remove at least one of particles, plasticizer or water from the liquid coolant.

7. The immersion cooling system of claim 1, wherein the filter comprises at least one of a filter screen, a semipermeable membrane or an activated carbon.

8. The immersion cooling system of claim 1, wherein a position of the pump is below a surface of the liquid coolant in the cooling tank.

9. The immersion cooling system of claim 1, wherein the cooling device is configured to circulate a liquid or a gas to make heat exchange with the liquid coolant.

10. The immersion cooling system of claim 1, wherein the pipeline extends into the cooling tank and has an outlet located within the cooling tank, wherein the filter is disposed at the outlet of the pipeline.

11. The immersion cooling system of claim 1, wherein the pipeline further has an outlet, the outlet is connected to the cooling tank and is located above a surface of the liquid coolant in the cooling tank.

12. An immersion cooling method, comprising:
immersing an electronic device in a liquid coolant in a cooling tank;
using a pump to draw the liquid coolant from the cooling tank into a pipeline for filtration; and
cooling the liquid coolant by a cooling device before the liquid coolant enters the pump, wherein the cooling device is directly connected to an input port of the pump via the pipeline.

13. The method of claim 12, wherein the liquid coolant is cooled to a temperature below a saturation temperature corresponding to a pressure in the pipeline before entering the pump.

14. The method of claim 12, further comprising:
causing the liquid coolant to pass through a filter after leaving the pump.

* * * * *